United States Patent [19]
Orban

[11] 4,103,243
[45] Jul. 25, 1978

[54] METHOD AND SYSTEM FOR CONTROLLING PEAK SIGNAL LEVELS IN A BANDLIMITED RECORDING OR TRANSMISSION SYSTEM EMPLOYING HIGH-FREQUENCY PRE-EMPHASIS

[75] Inventor: Robert A. Orban, Menlo Park, Calif.

[73] Assignee: Orban Associates, Inc., San Francisco, Calif.

[21] Appl. No.: 756,193

[22] Filed: Jan. 3, 1977

Related U.S. Application Data

[63] Continuation of Ser. No. 602,981, Aug. 8, 1975, abandoned.

[51] Int. Cl.² .................... H03B 3/02; H03K 5/08; H03G 11/04
[52] U.S. Cl. .................... 328/169; 307/237; 328/175; 330/126; 330/151
[58] Field of Search .......... 307/237; 328/167, 168, 328/169, 171–173, 175; 330/126, 151; 325/36, 46, 62, 147, 187; 179/15 BT, 100.4 C

[56] References Cited
U.S. PATENT DOCUMENTS

| | | | |
|---|---|---|---|
| 3,111,635 | 11/1963 | Skov et al. | 325/46 |
| 3,286,024 | 11/1966 | Melchoir | 307/237 X |
| 3,701,028 | 10/1972 | Markevich | 328/167 |
| 3,846,719 | 11/1974 | Dolby | 333/28 R |
| 3,898,573 | 8/1975 | Sherman | 328/167 |

*Primary Examiner*—John Zazworsky
*Attorney, Agent, or Firm*—Blakely, Sokoloff, Taylor & Zafman

[57] ABSTRACT

In a bandlimited recording or transmission system utilizing broadband limiting and high-frequency pre-emphasis followed by clipping, a unique combination of a lowpass filter and shelving filter are used to limit channel overload exhibited by prior art clipping and anti-aliasing filters. The pre-emphasis employs a split path signal flow, with a voltage controlled amplifier used on the high-frequency signal path.

15 Claims, 2 Drawing Figures

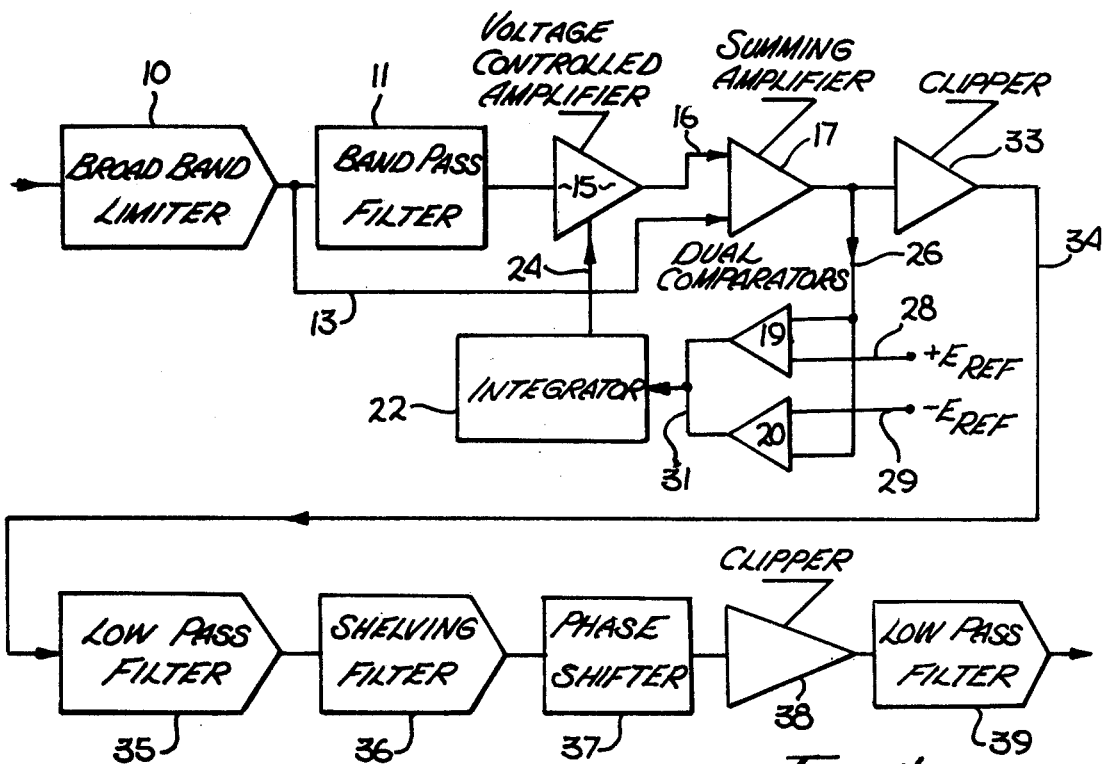
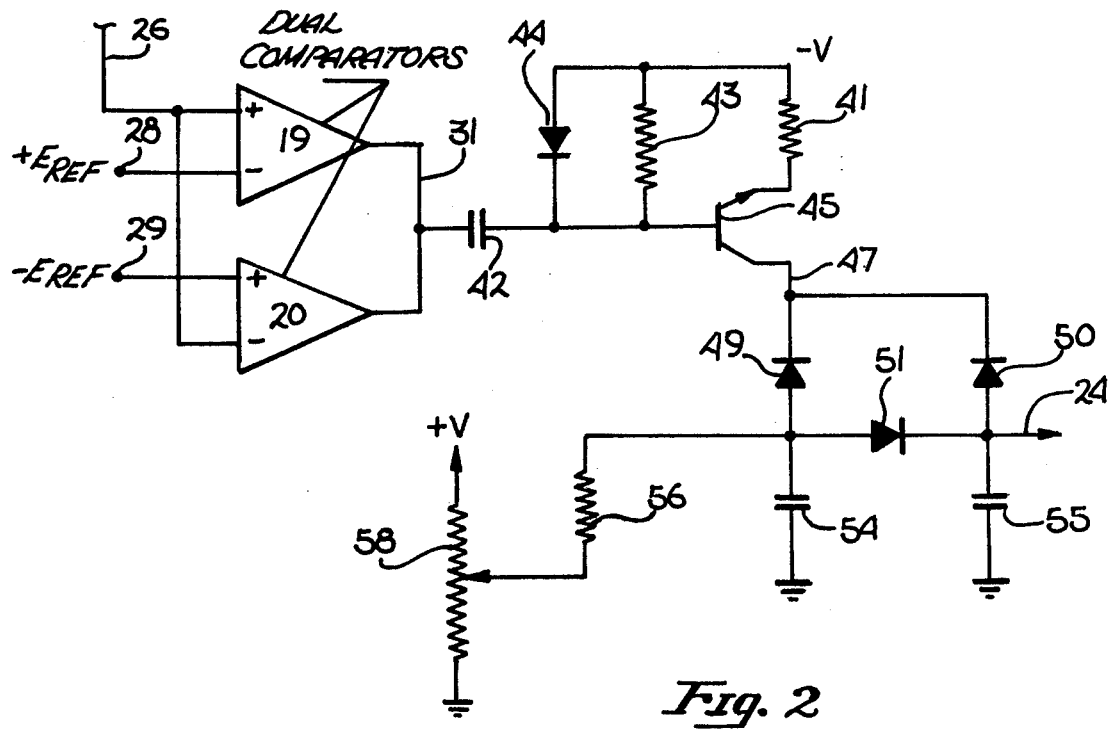

METHOD AND SYSTEM FOR CONTROLLING PEAK SIGNAL LEVELS IN A BANDLIMITED RECORDING OR TRANSMISSION SYSTEM EMPLOYING HIGH-FREQUENCY PRE-EMPHASIS

This is a continuation of application Ser. No. 602,981 filed Aug. 8, 1975 and now abandoned.

BACKGROUND OF THE INVENTION

1. Field of the Invention

The invention relates to the field of recording or transmitting high-frequency pre-emphasized signals where peak level control is required such as in frequency-modulated (FM) multiplex transmissions.

2. Prior Art

In some bandlimited audio transmission and recording systems (and other systems), high-frequency pre-emphasis is employed for purposes of reducing noise. Such systems often require peak level control, and are characterized by the fact that their overload point is very sudden and must not be exceeded for satisfactory system operation. However, as much as possible of the limited bandwidth must be used if the channel is to be used with maximum efficiency. Among the common systems included within this category are FM multiplex (stereophonic and quadraphonic) broadcast systems, disc recording systems, four-channel disc recording with FM subcarrier (CD-4) systems, optical film recording systems employing variable areas, and frequency-division multiplex telephony systems. Other systems (including non-audio systems) may also fall within this category, particularly when they tolerate some delay distortion and ringing.

Typically the audio signal (or other signal) is applied first to a broadband limiter having a finite attack time. The output of the limiter is coupled to a pre-emphasis filter to produce the desired high-frequency pre-emphasis. In the case of FM multiplex stereo broadcast systems in the United States, this pre-emphasis is set by federal regulations at 75 microsecond, single time constant pre-emphasis. To prevent channel overloading with signals containing significant high frequency components, the filter output in some systems is applied to a feedback-controlled lowpass filter to partially cancel the effects of the pre-emphasis.

The pre-emphasized signal requires instantaneous amplitude limiting since the broadband limiter (and feedback-controlled lowpass filter for systems employing such devices) have finite attack or rise times. Without such instantaneous limiting or clipping amplitude overshooting or channel overloading occurs. However, instantaneous limiting or clipping introduces troublesome high frequency components. Specifically, these high frequency components in a United States FM stereo broadcast system could cause interference with the 19kHz pilot tone, and interference between the main channel and subchannel. To avoid this problem and to eliminate high-frequency components in the input signal (which could also cause interference) an anti-aliasing filter is used before the transmission channel to reduce the high frequency components. These filters are generally sharp-cutoff, lowpass filters such as "elliptic function" filters. Again referring to United States FM stereo broadcast practices, these high performance filters are relatively flat to 15kHz and are down 50–60DB at 19kHz.

The use of the anti-aliasing filter introduces a new problem. The "ringing" and phase shifting characteristics of such filters causes rises in some amplitude peaks which result in channel overloading. Thus, the effects of clipping, which is employed to eliminate such overloading are partly lost by anti-aliasing filtering. Even for an ideal filter overloading will occur. For example, a Fourier analysis of a square wave shows that the amplitude of the fundamental sine wave exceeds the amplitude of the square wave by 2.1dB. Thus, when clipping occurs even for waveforms two octaves below the cut-off frequency of the anti-aliasing filter, substantial overloading or overmodulation occurs since the harmonics are stripped from the clipped waveform. For some commercial systems as much as 130%, or more, overmodulation for some conditions is experienced. To compensate for this problem, the dynamic range of the modulated signal is lowered to less than the maximum available range. This results in loss of volume range and, of course, loss in the quality of the transmitted audio signal in the case of FM broadcasting.

As will be seen, the present invention eliminates much of the prior art overloading due to the anti-aliasing low pass filter. Also some of the distortions caused by many existing overload protection devices, including perceivable high-frequency losses, are lessened. Moreover, the presently disclosed system reduces original cost, and alignment problems by eliminating some prior art redundant components.

As mentioned in some prior art pre-emphasis schemes, a lowpass, feedback controlled filter is employed following a pre-emphasis filter. In other systems, the signal is first applied to a feedback controlled low pass filter, and then to a pre-emphasis filter. As will be seen, the present invention employs a split signal path that eliminates one filtering element required by the above described prior art techniques, and has other advantages.

SUMMARY OF THE INVENTION

A system and method for controlling peak signal levels in a bandlimited recording or transmission system employing high-frequency pre-emphasis is described. A signal such as an audio signal is first applied to a broadband limiter. The limiter output is coupled to two separate paths; one path is coupled to one input terminal of a summing amplifier. The other path includes a bandpass filter and a voltage controlled amplifier coupled to the other input terminal of the summing amplifier. Dual comparators sense the output of the summing amplifier and provide a feedback control signal to the voltage controlled amplifier through a non-linear integrator. Thus, only the high-frequency components of the input signal pass through the voltage controlled amplifier for this high-frequency preemphasis network.

The pre-emphasized output of the summing amplifier is clipped by a clipper and then coupled to a lowpass filter. The output of the lowpass filter is applied to a shelving filter. In the presently preferred embodiment (for FM stereo broadcasting) the S-plane pole location for the shelving filter pole is approximately equal to the S-plane zero location of the pre-emphasis network.

The output of the shelving filter may be passed through a phase shifter optimized to provide maximum phase correction to the lowpass filter at a frequency equal to the cutoff frequency of the lowpass filter. This frequency tends to be critical for overloading, as the third harmonic of a fundamental of approximately one-third the lowpass filter cutoff frequency, which ordinarily subtracts from the amplitude of the fundamental, is significantly phase-shifted by the lowpass filter and tends to add to the fundamental instead.

A second clipper and a more gentle, non-overshooting lowpass filter may then be used at the output of the phase shifter for optimum performance.

BRIEF DESCRIPTION OF THE DRAWINGS

FIG. 1 is a block diagram of the presently preferred embodiment of the invented system.

FIG. 2 is a circuit diagram particularly illustrating the integrator used to control the voltage controlled amplifier.

DETAILED DESCRIPTION OF THE INVENTION

A method and system for controlling the peak signal levels in a bandlimited recording or transmission system employing high frequency pre-emphasis is described. The presently preferred embodiment of the invention is utilized in an FM multiplex, stereophonic broadcast system, and hence many of the specific details described herein are described in conjunction with such systems. Some described details such as cutoff frequencies, etc. have been selected to conform with the United States, Federal Communications Commission (FCC) Regulations, which regulations control FM broadcasts in the United States. It will be apparent that the invention has application to other audio and non-audio systems, particularly where pre-emphasis is utilized, including such systems as FM multiplex quadraphonic braodcast systems, disc recording systems, four channel disc recording by the FM carrier method, optical film recording (by the variable area method), and frequency-division multiplex telephony systems. Many specific circuit details have not been described in order not to over complicate the drawings, and to avoid concealment of the invention in unnecessary detail. It will be apparent to one skilled in the art that the blocks set forth in FIG. 1 may be readily fabricated from the details given below, employing known circuit techniques, and employing commercially available components.

Referring first to FIG. 1 broadband limiter 10 includes an input terminal for receiving an input audio signal or other signal. The broadband limiter is utilized to limit the peak values of the input signal as is commonly done in FM systems. In the presently preferred embodiment the limiter has a compression ratio of in excess of 50 to 1, and an attack time of approximately 3 miliseconds, or less.

The output of limiter 10 is coupled to two distinct paths, one leading to the bandpass filter 11 and the other, line 13, being coupled to one input terminal of the summing amplifier 17. The output of the bandpass filter 11 is coupled to the input terminal of a voltage controlled amplifier 15; the output of voltage controlled amplifier 15, lead 16, is coupled to the other input terminal of the summing amplifier 17. When its output is summed in the correct proportion with the direct signal on path 13, the bandpass filter 11 provides the required pre-emphasis to a frequency beyond the cutoff frequency of the transmission channel. The correctly pre-emphasized signal is produced at the output of summing amplifier 17. Thus, the gain of the filter 11 and the nominal (maximum) gain of the voltage controlled amplifier 15 are considered, along with the signal on lead 13. As previously mentioned, the FCC regulations call for a 75 microsecond, single time constant pre-emphasis for FM multiplex stereo broadcasts in the United States. The bandpass filter 11 is also designed to compensate for high frequency losses which accumulate in the path consisting of filters 35 and 36, phase shifter 37, clipper 18 and the lowpass filter 39. In the presently preferred embodiment, filter 11 is realized with an active RC network with maximum gain of 21.6dB at 19.5kHz and a "Q" of 1.09.

The voltage-controlled amplifier 15 provides voltage-variable gain for the signal present at the output of bandpass filter 11, which signal after amplification is coupled to lead 16. The control signal on lead 24 (output of integrator 22) is used to control the voltage-controlled amplifier. A description of the signal on lead 24 which is generated within integrator 22 will be discussed with FIG. 2.

The output of the summing amplifier 17, line 26, is coupled to the input of clipper 33 and to one input terminal of each of the comparators 19 and 20. The other input terminal of comparator 19, line 28, is coupled to a source of a positive reference potential; the other terminal of comparator 20, line 29, is coupled to a source of a negative reference potential. In the presently preferred embodiment the potentials on leads 28 and 29 are set such that the reference threshold of comparators 19 and 20 is set at 0.5dB higher than the threshold of broadband limiter 10. The dual comparators 19 and 20 compare the signal on lead 26 with the reference potentials on leads 28 and 29 and provide an output on line 31 which is coupled to the input terminal of integrator 22.

Referring to FIG. 2 the dual comparators 19 and 20 are again shown with the positive input terminal of comparator 19 and the negative input terminal of comparator 20 coupled to lead 26. The output of the comparators, lead 31, is coupled to one terminal of capacitor 42. The other terminal of capacitor 42 is coupled to one terminal of diode 44, resistor 43, and the base of transistor 45. The emitter terminal of transistor 45 is coupled to a negative potential through resistor 41. Resistor 43 and the other terminal of diode 44 are also coupled to the same source of the negative potential. As will be discussed, transistor 45 serves as a level shifter and current source for the integrator.

The collector terminal of transistor 45 is coupled to one terminal of each of the matched diodes 49 and 50. The other terminal of diode 49 is coupled to one terminal of diode 51, one terminal of capacitor 54, and to one terminal of resistor 56. The other terminal of resistor 56 is coupled to the wiper arm of potentiometer 58. Potentiometer 58 is coupled between a positive potential and ground. The other terminal of diode 50 is coupled to the other terminal of diode 51, one terminal of capacitor 55 and the output lead 24 of the integrator 22. The other terminals of capacitors 54 and 55 are coupled to ground.

While not shown, in the presently preferred embodiment, line 24 is coupled to the gate of a p-channel junction, field-effect transistor which is part of the voltage controlled amplifier 15 of FIG. 1. As will be discussed in more detail, the voltage (on lead 24) controls the gain of amplifier 15 by means of this field-effect transistor.

Clipper 33 (FIG. 1) which may be an ordinary clipping means performs the function of clipping amplitudes of the output signal from the summing amplifier 17. The clipping threshold for clipper 33 is set at the same threshold as dual comparators 28 and 29, in the presently preferred embodiment.

The clipped output from clipper 33 is applied to the input terminal of a lowpass filter 35 by lead 34. This filter may be of conventional design, and has a response which varies between zero and −0.6dB from DC to its cutoff frequency, and a rapid roll-off thereafter. The filter may be a standard "elliptical function" lowpass filter and may be realized with LC passive circuits, or an RC active network. The filter is characterized by approximately 25% overshoot. As will be discussed, the remaining elements 36, 37, 38, and 39 are utilized to compensate for this overshoot.

The majority of the overshoot associated with the filter 35 is compensated for by the shelving filter 36. The characteristics of shelving filter 36 are defined by a transfer function of the following form:

$$A = (aS+1)/(bS+1) \tag{1}$$

where $S$ is a complex variable in an S-plane.

For the presently preferred embodiment $a/b$ is equal to 0.79, or −2.1dB, and the frequency $1/a$ is approximately 15% of the cutoff frequency of the lowpass filter 35. However, it will be appreciated that these specific values may be varied depending upon the application. For the presently preferred embodiment and a 75 microsecond, single time constant pre-emphasis (system cutoff frequency of 15kHz) the complex S-plane zero location for the shelving filter is located at 13,333 radians/seconds, and the pole of this filter is located at 10,470 radians/second. This S-plane pole location for the shelving filter is approximately equal to the S-plane zero location of the preemphasis network comprising the bandpass filter 11, voltage control amplifier 15, and summing amplifier 17. The S-plane zero location of the shelving filter is approximately equal to the pre-emphasis required by the FCC for United States standard FM broadcast. The specific values cited would not, for example, be applicable to optical film where different ("Academy") preemphasis is employed.

The output of the shelving filter 36 is applied to the input of a phase shifter 37. The phase shifter 37 is optimized to provide maximum phase correction between the frequency which is approximately equal to one-third the cutoff frequency of the lowpass filter 35 and the third harmonic of this frequency. The reason for the selection of this frequency will be explained in more detail in conjunction with an explanation of the operation of the system of FIG. 1.

The output of phase shifter 37 is coupled to a clipper 38 which may be similar to clipper 33. The clipping level or threshold of this clipper is the same as clipper 33 for the presently preferred embodiment. The output of clipper 38 is coupled to a lowpass filter 39. Unlike filter 35 this filter may be more gentle, and in the presently preferred embodiment, this filter is a third order parabolic filter characterized by an overshoot of approximately 2%. Thus this filter does not appreciably distort the peak levels of the signals clipped by clipper 38.

The output of the lowpass filter 39 is directly connected (through a short line) to a recorder or modulator of a transmission system, in the presently preferred embodiment, without intermediate elements which may cause phase shifts, and hence change the peak levels of the signal. Preferably such line should be of low impedance and the circuit of FIG. 1 should be contained within the same enclosure as the stereo base band generator. This eliminates much of the radio frequency pickup, hum and noise interference associated with long transmission lines. However, such close proximity is not necessary to gain the advantages of the circuit of FIG. 1.

The lowpass filter 35, shelving filter 36, and when used the phase shifter 37, clipper 38, and lowpass filter 39 cause some high frequency roll-off, particularly due to the shelving filter 36 and lowpass filter 39. For example, in the presently preferred embodiment, the high frequency response at the cutoff frequency of lowpass filter 35 is down approximately 3.5dB. To compensate for this, the bandpass filter 11 is adjusted to yield a pre-emphasis at the output of the summing amplifier 17 which includes the desired (standard) pre-emphasis, plus additional pre-emphasis to compensate for this high frequency roll-off.

In order to better understand the system of FIG. 1, a brief discussion of the attack times or rise times of the various components may be helpful. Clippers 33 and 38 are assumed to provide instantaneous clipping particularly for audio frequencies. The attack time of the feedback system comprising bandpass filter 11, voltage controlled amplifier 15, summing amplifier 17, dual comparators 19 and 20, and integrator 22 is approximately three milliseconds. The recovery time or release time of these components (which is primarily a function of resistor 56) is approximately 10 milliseconds. This 3 millisecond attack time should be at least 1½ greater than the attack time of the broadband limiter 10 in order to prevent overshoots from limiter 10 from introducing spurious high frequency filtering.

Assume that an audio signal is applied to the broadband limiter 10 and such signal is pre-emphasized through the bandpass filter 11 and summed in the summing amplifiers 17. First the case will be examined where the output of the summing amplifier 17 is not sufficient in magnitude to activate either of the dual comparators 19 and 20. That is, the signal at the output of the summing amplifier 17 does not exceed the thresholds established by the reference potential on lines 28 and 29. Under these conditions the voltage-controlled amplifier 15 is at its maximum gain as controlled by the potential on lead 24. Briefly referring to FIG. 2, under these conditions no changing potential is present on line 31 and transistor 45 is not conducting. The positive potential on potentiometer 58 causes the capacitors 54 and 55 to be charged through resistor 56. The resultant potential on lead 24 is coupled to the p-channel junction field-effect transistor within the voltage controlled amplifier 15, and the nominal or quiescent potential on lead 24 is sufficient to pinch-off this transistor thereby producing maximum gain from amplifier 15.

Next assume the signal applied to limiter 10 contains significant high frequency components, and that the output of summing amplifier 17 exceeds the threshold established on either line 28 or 29. The output of either comparator 19 or 20 will become a positive-going signal for as long as this overload condition exists. This positive-going signal is coupled through capacitor 42 to the base of transistor 45 causing transistor 45 to conduct. The current through transistor 45 will be determined by the magnitude of resistor 41 and the amplitude of the output signal from the comparators. Since diodes 49 and 50 are matched, the current on lead 47 is divided between these diodes, and the current from the negative potential partially discharges capacitors 54 and 55. The partial discharge of capacitor 55, which is fed back through lead 24 to the voltage controlled amplifier 15, reduces the gain of this amplifier since the p-channel field-effect transistor will conduct. As long as transistor 45 continues to conduct the gain of amplifier 15 will be reduced by the potential on lead 24. However capacitor 54 is continually charged through resistor 56, and when the current through transistor 45 is cutoff (when the output of the summing amplifier 17 no longer exceeds the threshold levels) capacitor 54 again returns to its originally charged value. As capacitor 54 charges, the potential across diode 51 will increase until this potential exceeds diode 51's turn-on voltage, at which point diode 51 will conduct and charge capacitor 55. Whereas the voltage on capacitor 54 has a sawtooth ripple component, the delay in charging capacitor 55 caused by the turn-on threshold of diode 51 essentially eliminates any ripple component across capacitor 55. Therefore, the voltage-controlled amplifier 15 cannot modulate the signal on lead 16, and the consequent distortion is avoided.

As mentioned the use of a split signal flow path for pre-emphasis produces a more stable feedback control loop since no filter elements are in the control loop, and since the control loop characteristics are controlled by the comparators 19 and 20 and integrators 22. With the disclosed pre-emphasis technique and network minimum perceivable high frequency loss occurs since the resultant high frequency rolloff is of the shelving variety, with the S-plane poles staying fixed at all times. This characteristic corresponds well to the spectral distribution of music and assures that an overload in one section of the high frequency spectrum will not cause excessive filtering in another part of the high frequency spectrum. Since, in effect, the pre-emphasis filter itself is variable, there can be no significant mistracking between a fixed pre-emphasis filter and a variable de-emphasis filter, as in prior art circuits. In addition, since only the high frequency components are amplified by amplifier 15, reduction of the gain of amplifier 15 to zero will result in total cancellation of the pre-emphasis without error.

The output of amplifier 17 is clipped in an ordinary manner by clipper 33 and applied to the lowpass filter 35 without intermediate processing or interference. The low-pass filter 35 performs a typical lowpass filtering function. The remaining elements, filter 36, phase shifter 37, clipper 38 and lowpass filter 39 are used to correct for the ringing inherent in a real filter such as filter 35, and also to correct for the increase in amplitude caused by the removal of harmonics from the fundamental of a square wave, and the like. In the presently preferred embodiment phase shifter 37, clipper 38, and filter 39 are utilized in conjunction with shelving filter 36, however, the primary compensation is produced by filter 36, and in some embodiments the remaining elements may not be necessary.

The shelving filter 36 compensates for the previously described increases in peak levels which occur when the harmonics are removed from a square wave, or the like; additionally it can be shown that filter 36 exhibits an undershoot in its transient response. The convolution of the step responses of filters 35 and 36 illustrate that a 25% overshoot in the lowpass filter 35 is reduced to a total overshoot of approximately five percent as a result of a shelving filter 36 when square-wave signals are used.

The phase shifter 37 is used to further reduce this overshoot, and to particularly compensate for the most difficult frequency, that frequency being one-third the cut-off frequency of the lowpass filter 35. The rapid phase shift of the lowpass filter 35 in the region of its cutoff frequency severely shifts the phase of the third harmonic of the fundamental frequency located at approximately one-third the cutoff frequency of this filter. This harmonic (which is not substantially attenuated by filter 35) normally subtracts from the fundamental, and hence controls peak levels, however, with the phase shift of this harmonic, the harmonic adds to the peak level. Phase shifter 37 is optimized to compensate for this problem.

While the lowpass filter 35 and shelving filter 36, and to some extent the phase shifter 37, effectively reduced overshoots and over-loads, nonetheless some overloads occur, particularly those associated with noise-like signals, like vocal sibilants. An additional clipper 38 may therefore be desirable in some applications along with an additional low-pass filter 39, primarily for "backup" or "safety" reasons. However, since clipper 38 does not do a substantial amount of clipping, the high frequency components which require filtering by filter 39 are few, when compared to those which require filtering by the lowpass filter 35. Thus, the high frequency components resulting from the clipping of clipper 38 may be filtered by a lowpass filter with a gentle rate of attenuation such as filter 39. This filter is optimized for faithful pulse response, and is characterized by an overshoot of approximately 2 percent. Thus this filter does not appreciably distort the peak levels of the output signal from clipper 38.

It should be noted that since lowpass filter 35, shelving filter 36, and phase shifter 37 are all linear devices, their order may be permuted in any way. For example, lead 34 may be coupled to shelving filter 36, and the output of shelving filter 36 may be applied to lowpass filter 35.

Thus, an economical system and method has been disclosed for controlling overloading (and over-modulation) in a high frequency pre-emphasis bandlimited system. A shelving filter used in conjunction with a lowpass filter compensates for substantial problems associated with prior art systems. Moreover, the split signal path pre-emphasis network provides high-frequency control characterized by a family of shelving-like curves, thereby providing better high frequency performance.

I claim:

1. In a system for controlling peak signal levels in recording or transmission system, or the like which employs high frequency pre-emphasis the combination of:

input means for receiving an input signal;
high frequency pre-emphasis means coupled to said input means, for emphasizing high frequencies of said input signal;
clipping means for clipping a signal, coupled to said pre-emphasis means; and,
a shelving filter coupled to said clipping means having a transfer function which includes a factor in the general form:

$$(aS+1)/(bS+1)$$

where $a$ and $b$ are non-zero constants and where $S$ is a complex variable;
whereby peak levels of an output of said shelving filter are readily controlled.

2. The system defined by claim 1 wherein an S-plane pole location of said shelving filter is approximately equal to the location of an S-plane zero of said pre-emphasis means.

3. The system defined by claim 1 including a lowpass filter coupled to said shelving filter.

4. The system defined by claim 3 including a phase shifting means, a second clipping means and a second lowpass filter, the input of said second clipping means being coupled to said phase shifting means, the output of said second clipping means being coupled to the input of said second lowpass filter.

5. The system defined by claim 4 wherein said phase shifting means is optimized at approximately the cutoff frequency of said lowpass filter.

6. The system defined in claim 5 wherein said input means includes a broadband limiter.

7. The system defined by claim 1 wherein said pre-emphasis means includes a variable gain amplifier, the gain of which may be controlled.

8. The system defined by claim 7 wherein the output of said input means is coupled to a bandpass filter and wherein the output of said bandpass filter is coupled to the input of said variable gain amplifier, the output of said amplifier being coupled to one input terminal of a summing amplifier, and wherein the output of said input means is coupled to the other input terminal of said summing amplifier.

9. The system defined by claim 8 including feedback control means for sensing the output of said summing amplifier and for producing a control signal for controlling the gain of said variable gain amplifier.

10. The system defined by claim 9 wherein said feedback control means includes a non-linear integrator.

11. The system defined by claim 1 including compensation means for providing additional pre-emphasis before said clipping means said additional pre-emphasis to compensate for high frequency roll-off which may be caused by said shelving filter.

12. In a network for controlling peak levels in a broadband recording or transmission system employing high frequency pre-emphasis, and improvement for obtaining high frequency pre-emphasis of an input signal comprising:
   a summing amplifier having at least two input terminals, one of said input terminals being coupled to receive said input signal;
   a bandpass filter, coupled to receive said input signal;
   a variable gain amplifier, controlled by a control signal, the input of said variable gain amplifier being coupled to the output of said bandpass filter, and the output of said variable gain amplifier being coupled to the other said input terminal of said summing amplifier; and
   control signal generation means for generating said control signal, comprising; a comparator means for comparing signals coupled to the output of said summing amplifier and a non-linear integrator, the input of said integrator coupled to the output of said comparator means and the output of said integrator coupled to said variable gain amplifier;
   whereby said variable gain amplifier controls the gain of the high frequency components of said input signal.

13. The improvement defined by claim 12 wherein said non-linear integrator includes a current source controlled by said output of said comparator means, and a first and second capacitor, said first and second capacitor being coupled to said current source through a pair of matched diodes, said second capacitor being coupled to said variable gain amplifier.

14. The improvement defined by claim 13 including a third diode interconnecting said first and second capacitors.

15. The improvement defined by claim 14 including charging means for charging said first capacitor, said charging means being used to control the recovery time of said non-linear integrator.

* * * * *